United States Patent
Shelton et al.

(10) Patent No.: US 6,958,498 B2
(45) Date of Patent: Oct. 25, 2005

(54) OPTIMIZED CONTACT DESIGN FOR FLIP-CHIP LED

(75) Inventors: Bryan Shelton, Bound Brook, NJ (US); Ivan Eliashevich, Maplewood, NJ (US); Hari Venugopalan, Somerset, NJ (US)

(73) Assignee: Emcore Corporation, Somerset, NJ (US)

( * ) Notice: Subject to any disclaimer, the term of this patent is extended or adjusted under 35 U.S.C. 154(b) by 44 days.

(21) Appl. No.: 10/256,402

(22) Filed: Sep. 27, 2002

(65) Prior Publication Data

US 2004/0061123 A1 Apr. 1, 2004

(51) Int. Cl.⁷ .............................................. H01L 29/22
(52) U.S. Cl. ........................................ 257/99; 257/79
(58) Field of Search ............................. 257/79, 81, 91, 257/94, 99, 98, 88; 372/44, 46

(56) References Cited

U.S. PATENT DOCUMENTS

| | | | |
|---|---|---|---|
| 5,006,908 A | | 4/1991 | Matsuoka et al. |
| 5,309,001 A | * | 5/1994 | Watanabe et al. ............. 257/99 |
| 5,617,446 A | | 4/1997 | Ishibashi et al. |
| 5,696,389 A | * | 12/1997 | Ishikawa et al. ............. 257/99 |
| 5,698,865 A | | 12/1997 | Gerner et al. |
| 6,054,723 A | | 4/2000 | Tajiri et al. |
| 6,078,061 A | | 6/2000 | Koya |
| 6,268,618 B1 | | 7/2001 | Miki et al. |
| 6,281,526 B1 | | 8/2001 | Nitta et al. |
| 6,287,947 B1 | | 9/2001 | Ludowise et al. |
| 6,307,218 B1 | | 10/2001 | Steigerwald et al. |
| 6,486,499 B1 | * | 11/2002 | Krames et al. ............. 257/81 |
| 6,518,598 B1 | * | 2/2003 | Chen ............................ 257/91 |
| 6,614,056 B1 | * | 9/2003 | Tarsa et al. .................. 257/91 |
| 2001/0032985 A1 | | 10/2001 | Bhat et al. |

FOREIGN PATENT DOCUMENTS

| | | |
|---|---|---|
| JP | 06 310752 | 11/1994 |
| JP | 7030153 | 1/1995 |
| WO | WO 01/41223 | 6/2001 |
| WO | WO 01/47036 A1 | 6/2001 |

OTHER PUBLICATIONS

Guo X et al, "Current Crowding in Gan/Ingan Light Emitting Diodes on Insulating Substrates," Journal of Applied Physics, vol. 90, No. 8, pp. 4191–4195, (2001).

Kim Hyunsoo et al, "Lateral current transport path, a model for GaN–based light–emitting..., " Applied Physics Letters, vol. 81, No. 7, pp. 1326–1328, (2002).

Shatalov M et al., "Lateral Current Crowding in Deep UV Light Emitting Diodes...," Japanese Journal of Applied Physics, vol. 41, No. 8, pp. 5083, 5087, (2002).

* cited by examiner

Primary Examiner—Tom Thomas
Assistant Examiner—Matthew C Landau
(74) Attorney, Agent, or Firm—Fay, Sharpe, Fagan, Minnich & McKee, LLP

(57) ABSTRACT

Light emitting diodes are provided with electrode and pad structures that facilitate current spreading and heat sinking. A light emitting diode may be formed as a die with a stacked structure having a first region and a mesa projecting from a surface of the first region. A first electrode may substantially cover the mesa and have a plurality of pads disposed thereon maximizing a contact area in relation to the first electrode. A second electrode may be disposed as a trace on the surface of the first region, the trace having a spiral, segmented/interdigitated, loop or pattern. Optionally, the trace includes corner spikes projecting outwardly toward edges of the first electrode.

37 Claims, 13 Drawing Sheets

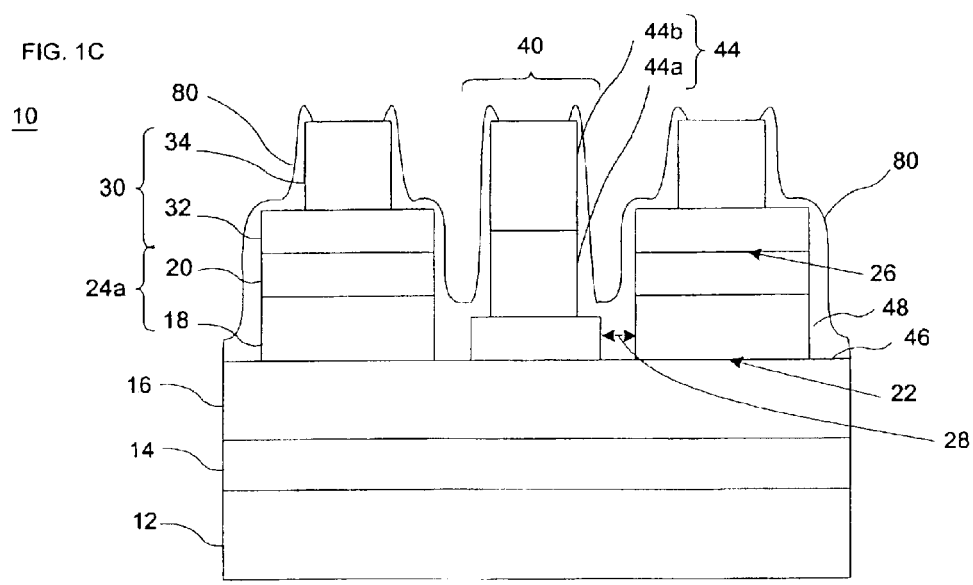
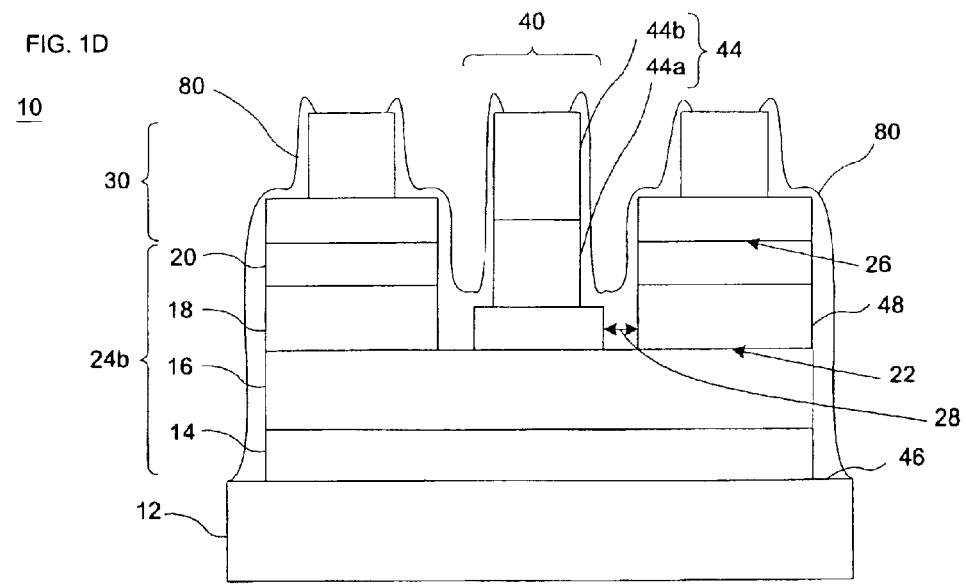

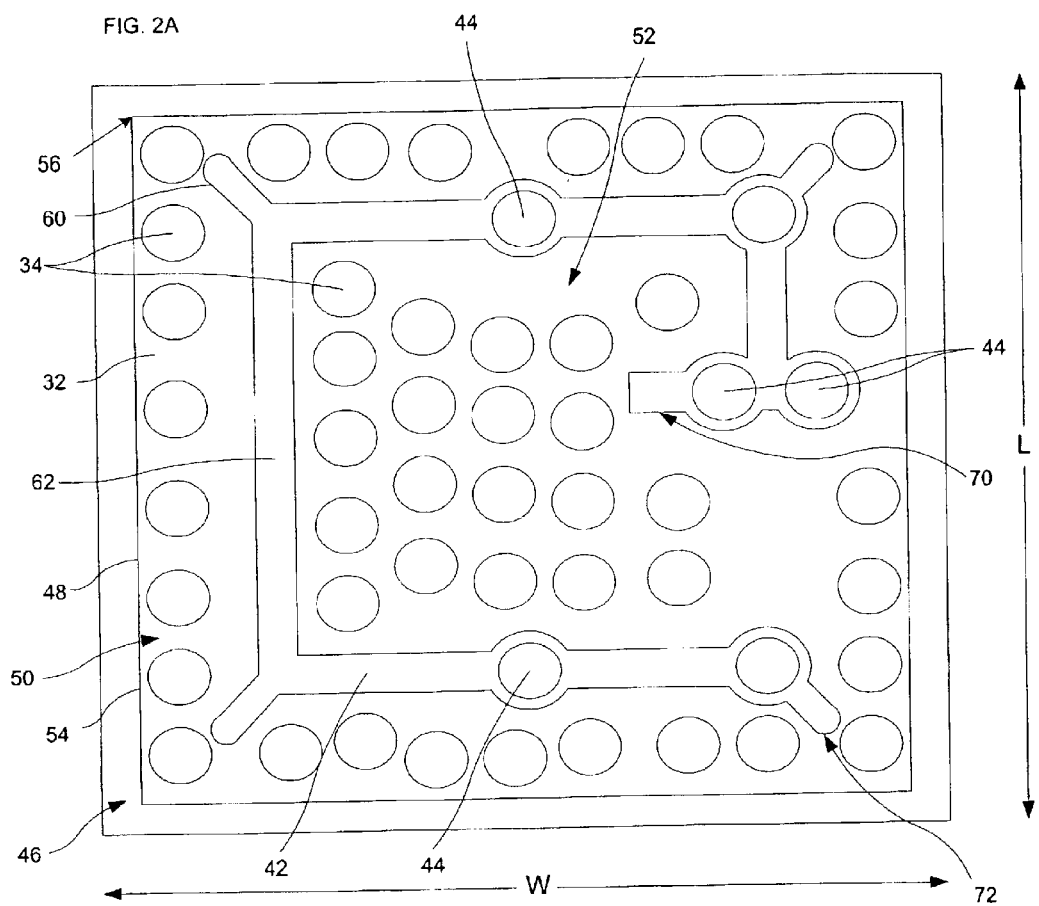

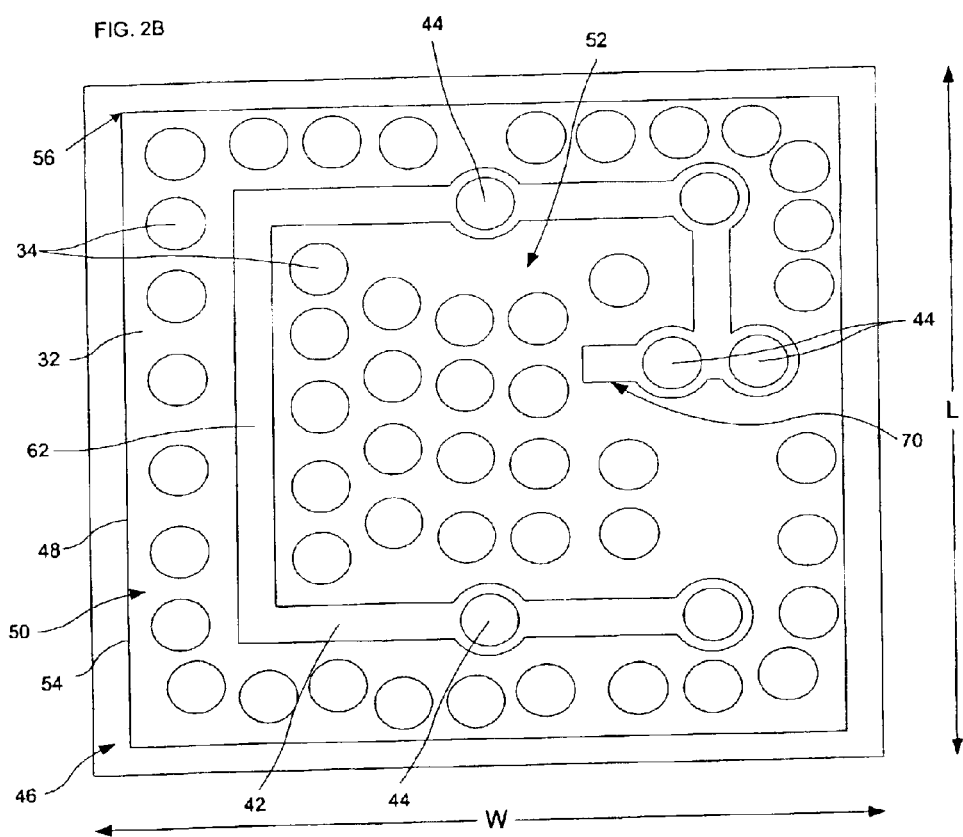

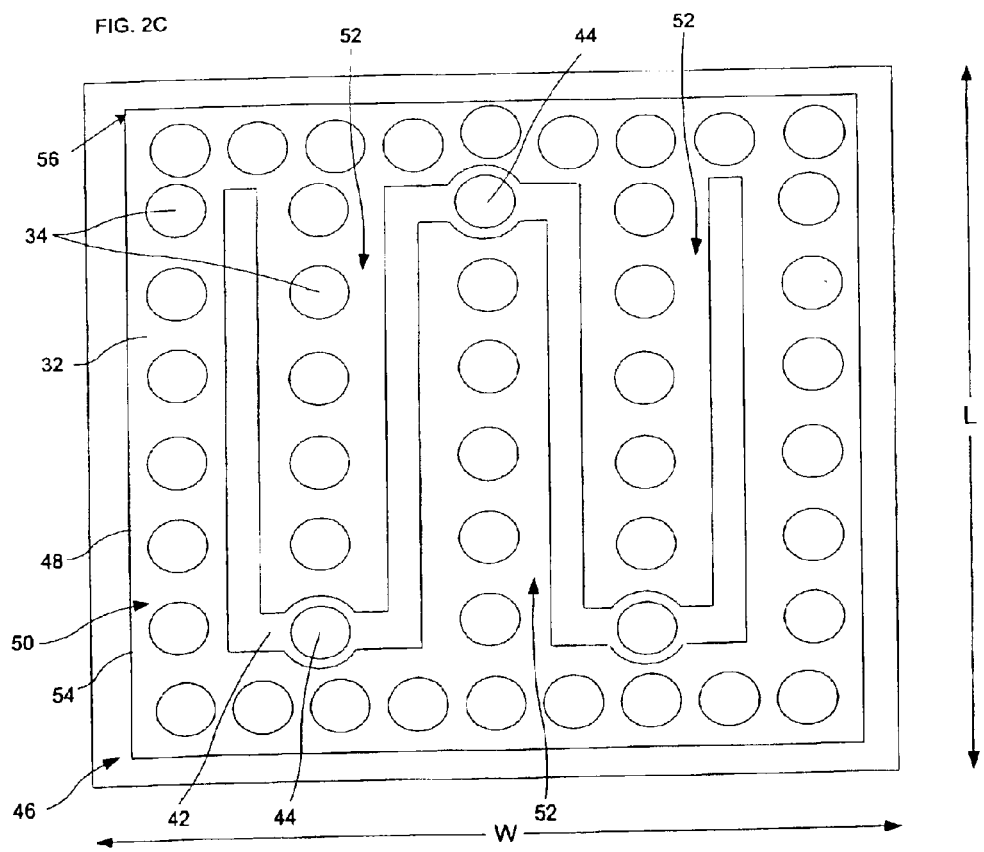

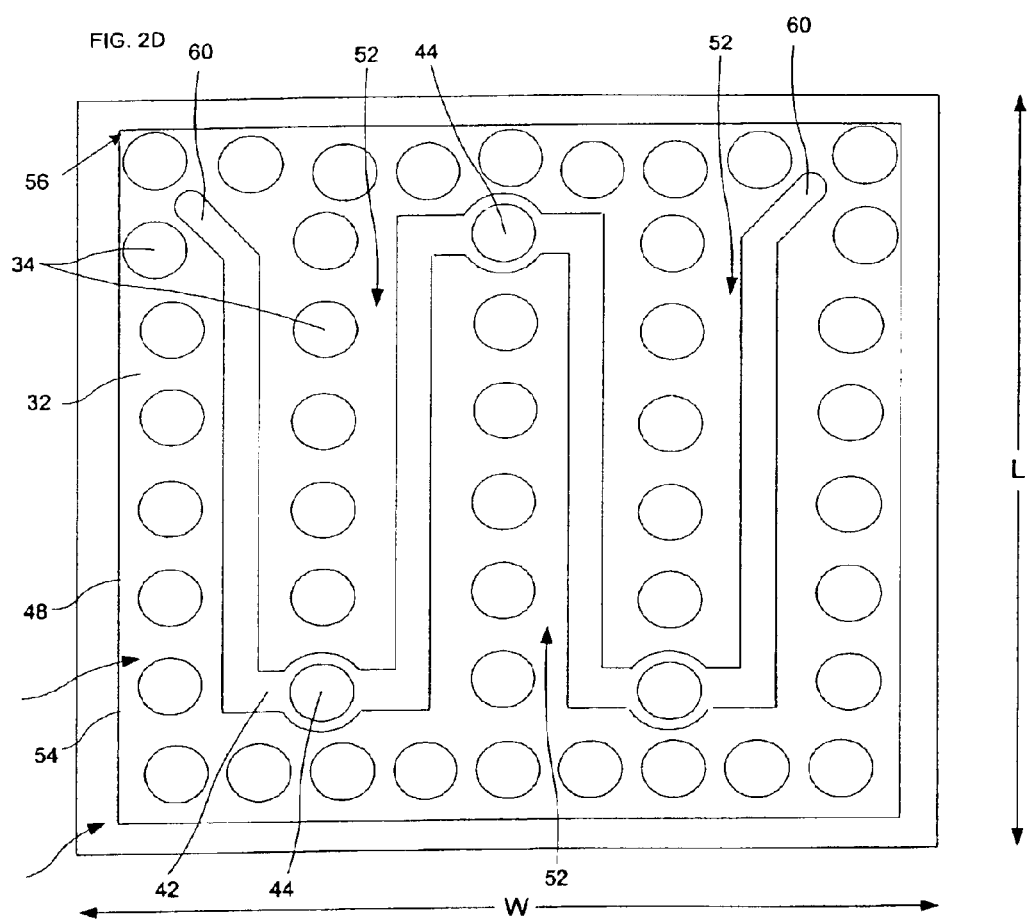

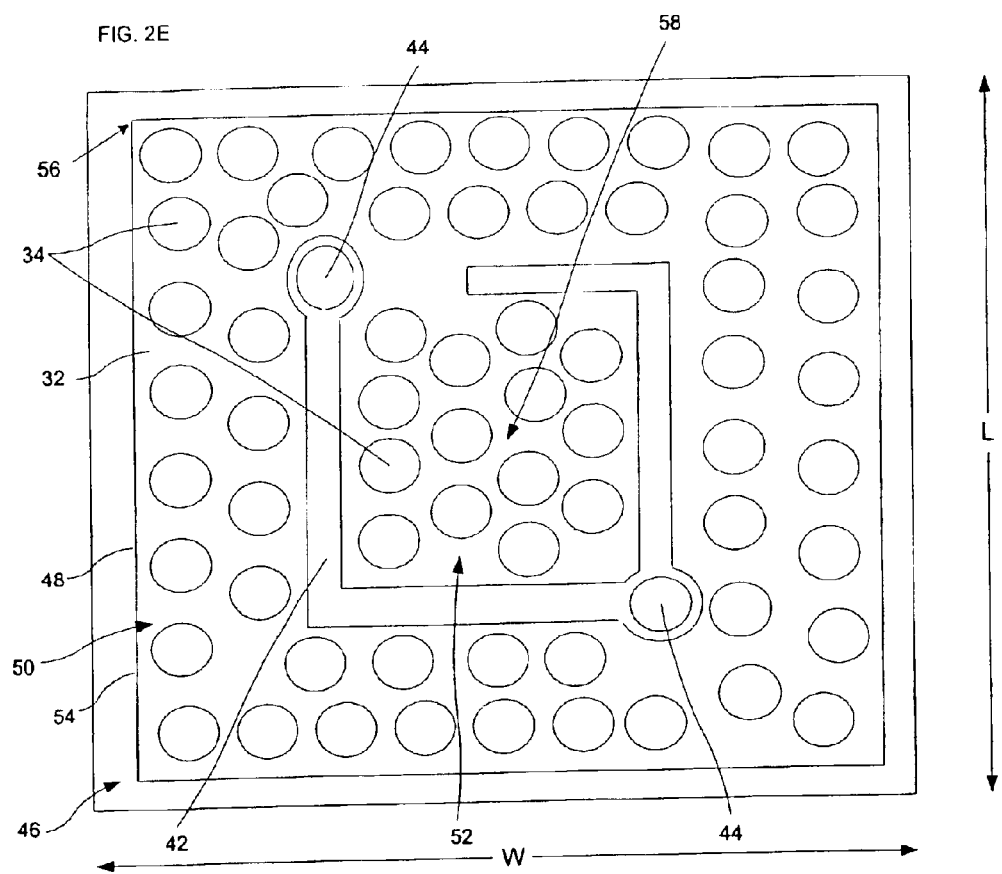

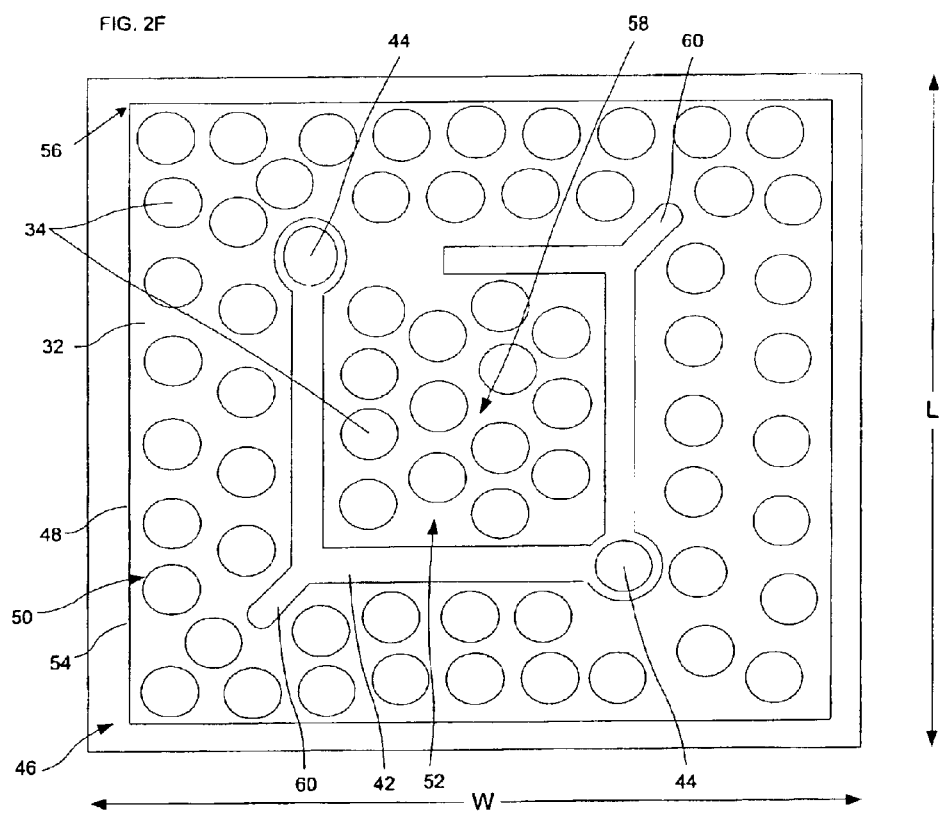

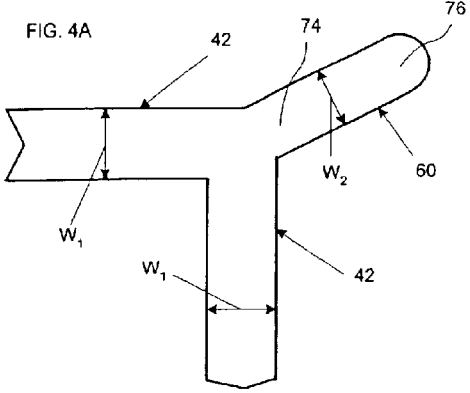
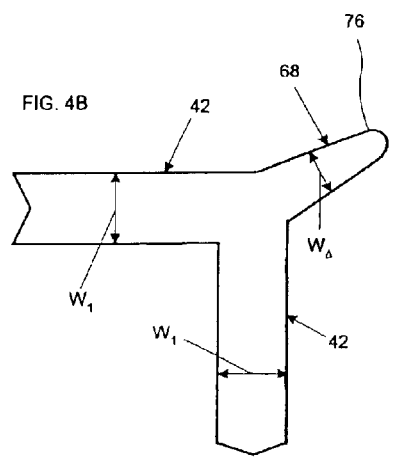
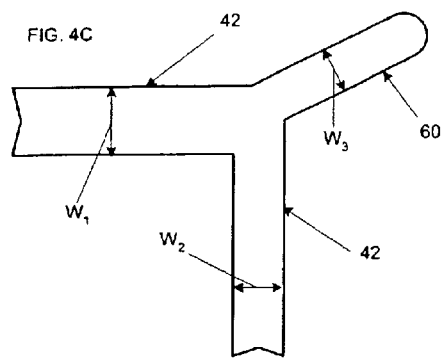
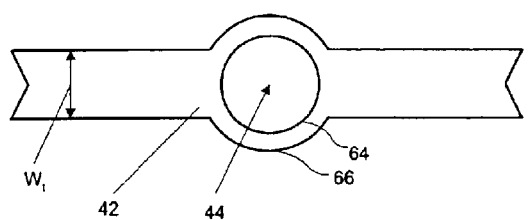

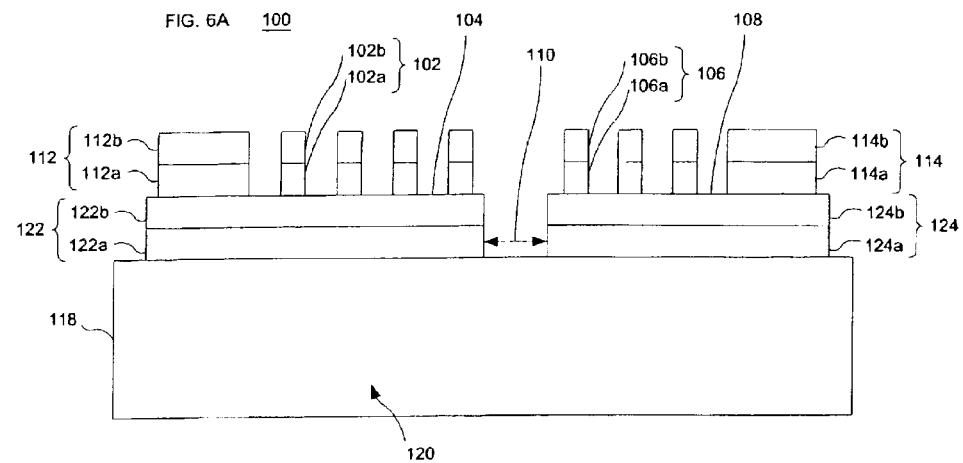
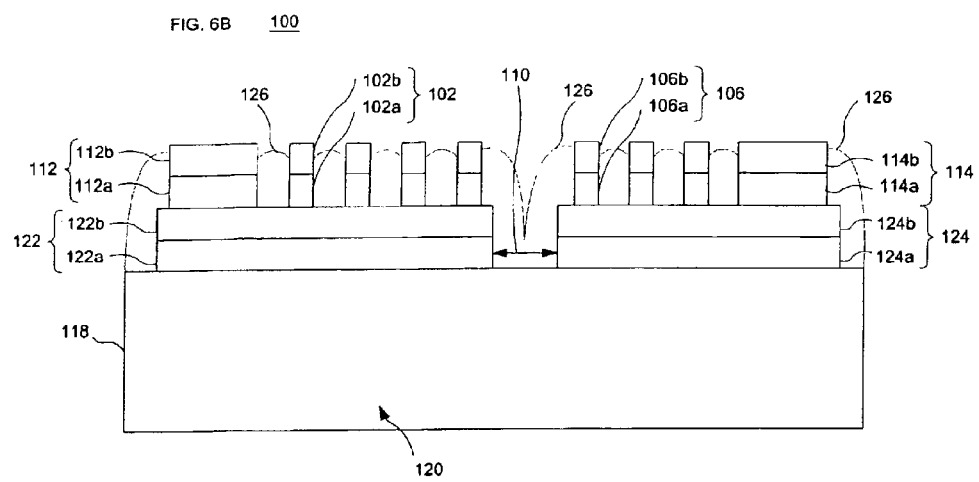

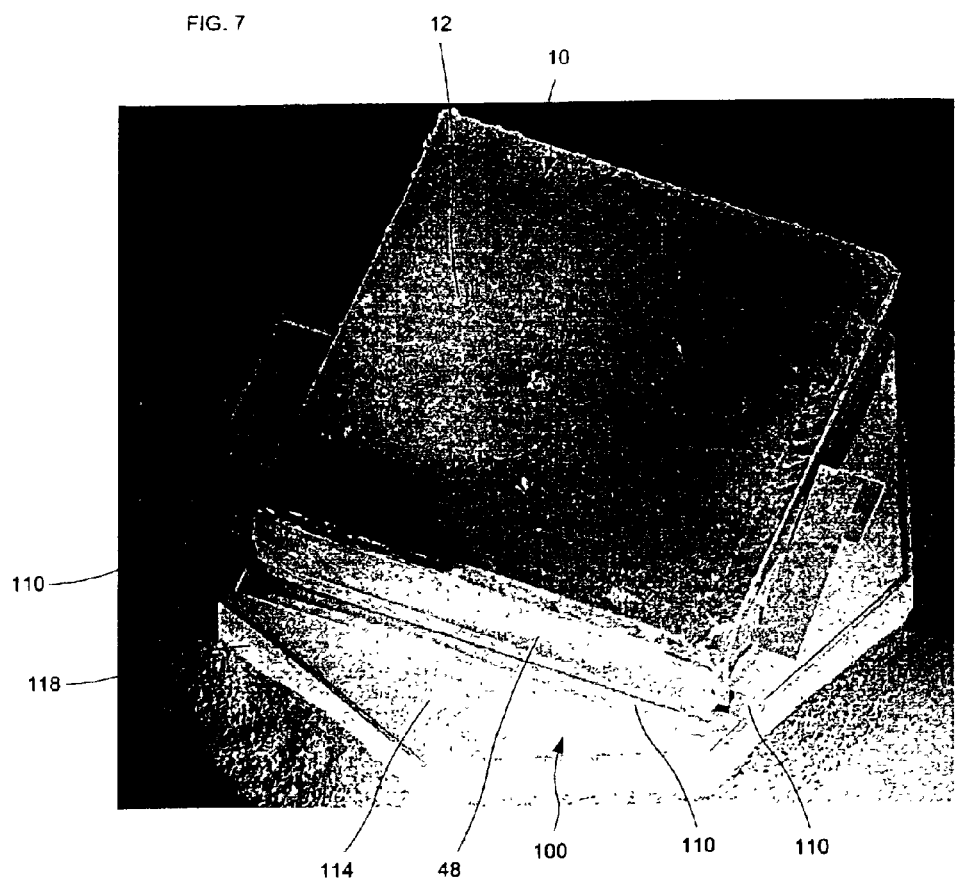

OPTIMIZED CONTACT DESIGN FOR FLIP-CHIP LED

BACKGROUND OF THE INVENTION

The present invention relates to optoelectronic devices such as light-emitting diodes. In particular, the present invention relates to light-emitting diodes having an optimized contact geometry in a flip-chip configuration.

Light-emitting diodes ("LEDs") may include thin layers of semiconductor material of two opposite conductivity types, referred to as p-type and n-type. The layers may be disposed in a stack on a substrate. The stack may include one or more layers of n-type material in one part of the stack and one or more layers of p-type material in another part of the stack. The stacked material, including the substrate, may form a wafer. The wafer may be cut apart to form individual dies constituting separate LEDs. The junction between the p-type and n-type material ("the p-n junction") may include directly abutting p-type and n-type layers, or may include one or more intermediate layers that may be of any conductivity type.

In operation, electric current passing through an LED is carried principally by electrons in the n-type layers and by electron vacancies or "holes" in the p-type layers. The electrons and holes move in opposite directions toward the junction, and recombine with one another at the junction. Energy released by electron-hole recombination is emitted as light. As used in this disclosure, the term "light" radiation includes infrared and ultraviolet wavelength ranges, as well as the visible range. The wavelength of the light depends on factors including the composition of the semiconductor materials and the structure of the junction.

Electrodes may be connected to the n-type and p-type layers. The materials in the electrodes are selected to provide low-resistance interfaces with the semiconductor materials. The electrodes, in turn, are provided with pads suitable for connection to wires or other conductors that carry current from external sources. The pads may transfer heat away from the LED. The pad associated with each electrode may be a part of the electrode, having the same composition and thickness of the electrode, or may be a distinct structure that differs in thickness, composition, or both from the electrode itself. The term "electrode-pad unit" is used herein to refer to the electrode and pad, regardless of whether the pad is a separate structure or merely a region of the electrode.

LEDs formed from certain semiconductor materials normally use nonconductive substrates to promote proper formation of the semiconductor layers. The nonconductive substrate typically is left in place, so that an electrode cannot be provided on the bottom surface of the bottom layer. For example, gallium nitride-based materials such as GaN, AlGaN, InGaN and AlInGaN, are used, as well as aluminum nitride (AlN), alumina and zinc oxide (ZnO) to form LEDs emitting light in various wavelength ranges including blue and ultraviolet. These materials typically are grown on insulating substrates such as sapphire or alumina.

LEDs incorporating an insulating substrate must include a bottom electrode at a location on the stack above the substrate but below the junction. Typically, the upper layer or layers of the stack are removed in a region covering part of the area of each die after formation of the stack, so as to provide an upwardly-facing lower electrode surface on a layer at or near the middle of the stack in each die. This leaves a region referred to as a "mesa" projecting upwardly from the lower electrode surface and covering the remaining area of the die. The area of the die occupied by the lower electrode surface does not emit light. It is desirable to keep the horizontal extent of this inactive area as small as possible.

The top electrode typically is formed on the top surface of the stack, i.e., the top surface of the top semiconductor layer. Typically, the layers in the stack above the junction are transparent, so that light emitted at the junction can pass out of the stack through the top surface. The top electrode is arranged so that it does not block all of the emitted light. For example, an opaque top electrode may cover only a small portion of the top surface of each die. However, the current passing from such an electrode will tend to flow downwardly through the stack so that the current passes predominantly through the area of the junction disposed beneath the electrode. This phenomenon, referred to as "current crowding," results in light emission concentrated in that area of the junction beneath the electrode, precisely where it will be most effectively blocked by the electrode. The amount of useful light reaching the outside of the die per unit of electrical current passing through the die, commonly stated as the external quantum efficiency of the die, is reduced by this phenomenon. Current crowding can also occur in the lower region, so that light emission is concentrated in the area of the junction near the lower electrode. Current crowding is a significant consideration with LEDs formed from materials having relatively high electrical resistivity, such as the gallium nitride-based materials. In addition to current crowding, heat dissipation is also a significant consideration for high powered LEDs.

To alleviate the current crowding problem, LEDs have been provided with electrodes that promote "current spreading" by dispersing current laterally over the p-type material and the n-type material. In a "top emitting" die, the top or p-electrode may be transparent and may extend over substantially the entire top surface of the die. The top electrode is provided with a relatively small, opaque pad for connection to external circuitry. However, even a nominally transparent electrode will absorb some of the light emitted in the die. A thicker top electrode, which provides more effective current spreading, aggravates this problem. Such a thick electrode promotes a low spreading resistance across the p-type material. A similar solution could be used for the n-type electrode. However, areas covered by the n-type electrode will not emit light, so such areas should be minimized.

Other LEDs are mounted in a "flip-chip" arrangement, with the top surface of the LED facing toward the mounting and with the substrate facing away from the mounting. The substrate is transparent to light at the emission wavelength of the LED, so that emitted light can pass out of the LED through the substrate. The light will pass through transparent stack layers and be emitted from a transparent substrate. The term "transparent substrate" is used herein to refer to a material that has an absorption coefficient on the order of 10 $cm^{-1}$ or less at the emission wavelength of the LED.

Various proposals have been advanced for achieving a good balance between current spreading and light blockage by the electrodes in a top-emitting die. One design for promoting current spreading is shown in U.S. Pat. No. 6,307,218. That design includes one electrode partly or wholly surrounding the other electrode, when examined from a top plan view. Current spreading may also be performed by a design having an outer electrode substantially surrounding the edges of the top surface with an outer electrode. The outer electrode may have one or more arms disposed so that the arms surround the light-emitting region of the LED.

Although the U.S. Pat. No. 6,307,218 patent states that the same electrode designs used in a top-emitting die can be employed in a flip-chip die, this would not lead to an optimum solution. Considerations such as current spreading, loss of active die area to areas occupied by the n-electrode and blockage of light emission by electrodes and pads are different in a flip-chip die. Moreover, considerations relating to heat extraction from the die in flip-chip designs are different from those encountered in top-emitting designs. Therefore, a need exists for improved LED designs.

SUMMARY OF THE INVENTION

The present invention provides an LED having an optimized electrode-pad unit configuration.

In accordance with one aspect of the present invention, a light-emitting diode is provided. The light-emitting diode comprises a structure, a p-type electrode-pad unit, a trench and an n-type electrode-pad unit. The structure includes regions of n-type and p-type semiconductor. The p-type semiconductor overlies the n-type region and defines a top surface remote from the n-type region. The structure defines an active light-emitting region between the n-type region and the p-type region. The structure has edges bounding the top surface. The p-type electrode-pad unit includes a p-electrode and a p-pad. The p-electrode is disposed on the top surface and the p-pad is disposed on the p-electrode. The trench is remote from the edges, and extends into the structure from the top surface through the p-type and the active light-emitting regions to the n-type region. The n-type electrode pad unit includes an elongated n-electrode and an n-pad. The elongated n-electrode is disposed in the trench in contact with the n-type region. The n-pad is disposed on the elongated n-electrode.

Preferably, the p-electrode substantially covers the top surface and substantially surrounds the trench. The elongated n-electrode preferably includes a plurality of connected segments. The elongated n-electrode and the trench preferably each have a configuration, as seen in plan view from said top surface, including a main region and at least one spike region projecting outwardly from the main region toward the edges. The spike region of the elongated n-electrode has a base connected to the main region of the elongated n-electrode and an end opposite the base. Preferably, the elongated n-electrode has a spiral geometry, a serpentine geometry, or an open loop geometry.

Preferably, the p-electrode is a reflective p-electrode substantially overlying the top surface and the p-pad comprises a plurality of p-pads distributed across the reflective electrode. The light-emitting diode preferably includes a transparent substrate underlying the n-type region.

Preferably, the light-emitting diode further comprises a connection panel. The structure is mounted on the connection panel with the top surface facing toward the connection panel and the n-type region facing away from the connection panel. The connection panel preferably includes one or more p-connections and one or more n-connections. The p-pad preferably comprises one or more p-pads connected to the one or more p-connections. The n-pad preferably comprises one or more n-pads connected to the one or more n-connections. The p-connections may include solder balls that are disposed to maximize a contact area. The contact area acts as a heat sink. Preferably, the contact area covers at least 20% of the p-electrode.

In accordance with another aspect of the present invention, a light-emitting diode is provided. The light-emitting diode comprises a structure, a p-type electrode-pad unit, a trench and an n-type electrode pad unit. The structure includes a transparent substrate and regions of n-type and p-type GaN based semiconductor. The n-type GaN based semiconductor overlies the transparent substrate. The p-type GaN based semiconductor overlies the n-type region and defines a top surface remote from the transparent substrate. The structure defines an active light-emitting region between the n-type region and the p-type region. The structure has edges bounding the top surface. The p-type electrode-pad unit includes a reflective p-electrode and one or more p-pads. The reflective p-electrode has an outer edge, and is disposed on and substantially covers the top surface. The p-pads are disposed on the reflective p-electrode. The trench is remote from the edges extending into the structure from the top surface through the p-type and the active light-emitting regions to the n-type region. The reflective p-electrode substantially surrounds the trench, with the outer edge being remote from the trench. The n-type electrode pad unit includes an elongated n-electrode and an n-pad. The elongated n-electrode is disposed in the trench in contact with the n-type region. The elongated n-electrode includes an edge. The one or more n-pads are disposed on the elongated n-electrode. The trench and the elongated n-electrode each have a configuration, as seen in plan view from the top surface, including a main region in the form of a spiral and a plurality of spike regions projecting outwardly from the main region towards the edges. The spike regions of the elongated n-electrode each have a base connected to the main region of the elongated n-electrode and an end opposite the base. The edge of the elongated n-electrode is spaced at a distance from the outer edge of the reflective p-electrode such that current spreading is substantially uniform across the light-emitting diode.

The foregoing aspects, features and advantages of the present invention will be further appreciated when considered with reference to the following description of the preferred embodiments and accompanying drawings, wherein like numerals represent like elements.

BRIEF DESCRIPTION OF THE DRAWINGS

FIGS. 1A–F are cross-sectional views of an LED in accordance with aspects of the invention.

FIGS. 2A–F are top plan views of LEDs in accordance with aspects of the invention.

FIG. 3 is an illustration of an n-electrode trace segment depicted in FIGS. 2A–F.

FIGS. 4A–C are illustrations of n-electrode traces having corner spikes in accordance with aspects of the invention.

FIGS. 6A–B are cross-sectional views of an LED connection panel.

FIG. 7 is a perspective view of an LED mounted on a connection panel.

DETAILED DESCRIPTION

Figure 1A:
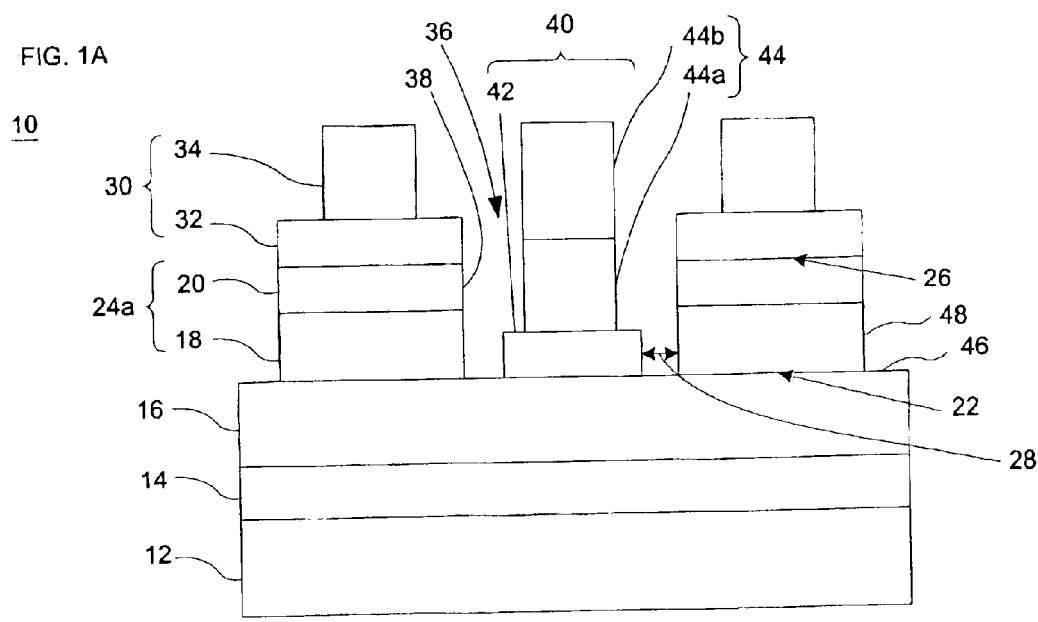
Figure 1B:
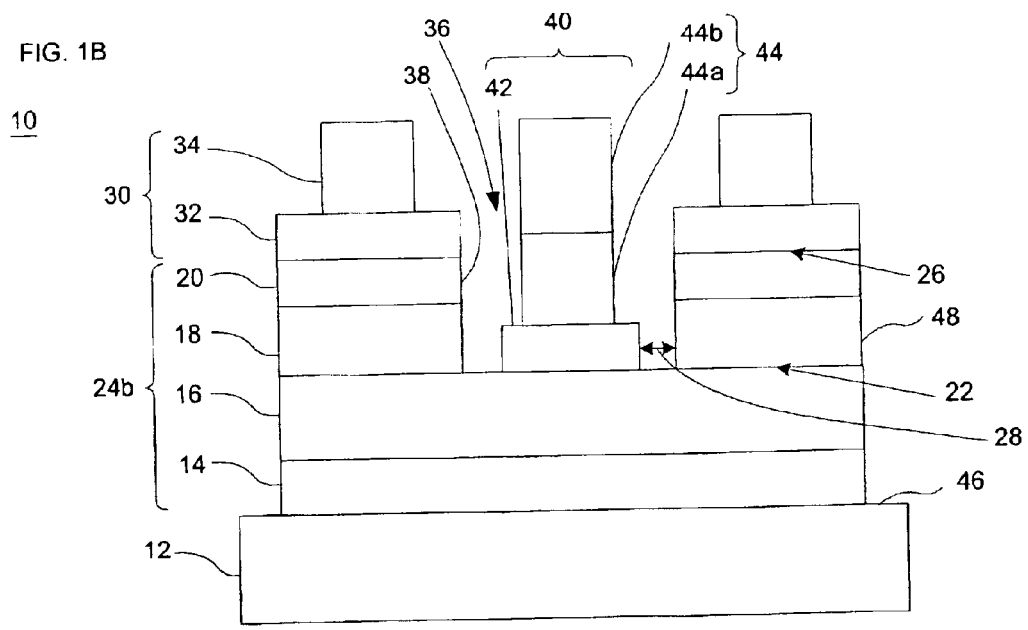

In accordance with one embodiment of the present invention, FIGS. 1A–F illustrate an LED 10 having a stacked structure of semiconductor layers on a substrate 12. The substrate 12 is preferably transparent. The substrate 12 may comprise gallium-nitride based materials, alumina, AlN, ZnO, silicon carbide (SiC), sapphire or other suitable materials. The structure and composition of the various layers incorporated in the stack and the sequence of layers in the stack may be selected according to known principles and techniques to provide the desired emission characteristics. The fabrication processes used to form the stacked structure are also well known. Most commonly, the various layers which form the stacked structure are deposited on the substrate 12 in sequence by techniques such as metal organic chemical vapor deposition ("MOCVD"), molecular beam epitaxy ("MBE") and the like.

The stacked structure includes a first region 16 having a semiconductor material of a first type and a second region 20 having a semiconductor material of a second type. For instance, the first region 16 may be formed from an n-type semiconductor and the second region 20 may be formed from a p-type semiconductor. Regions 16 and 20 may each include one or more layers. The first region 16 has a surface 22 facing away from the substrate 12.

The semiconductors may be III–V semiconductors, i.e., materials according to the stoichiometric formula $Al_aIn_b$-$Ga_cN_xAs_yP_z$ where (a+b+c) is about 1 and (x+y+z) is also about 1. Most typically, the semiconductor materials are nitride-based semiconductors, i.e., III–V semiconductors in which x is 0.5 or more, most typically about 0.8 or more. Most commonly, the semiconductor materials are pure nitride semiconductors, i.e., nitride-based semiconductors in which x is about 1.0. The term "gallium nitride based semiconductor" as used herein refers to a nitride-based semiconductor including gallium. The p-type and n-type conductivity may be imparted by conventional dopants and may also result from the inherent conductivity type of the particular semiconductor material. For example, gallium nitride based semiconductors typically are inherently n-type even when undoped. By way of example only, n-type nitride-based semiconductors may include conventional electron donor dopants such as Si, Ge, S, and O, whereas p-type nitride-based semiconductors may include conventional electron acceptor dopants such as Mg and Zn. Alternatively, the nitride may be omitted. Phosphorous or arsenic may be used in place of nitride, resulting in gallium phosphide or gallium arsenide based semiconductors, respectively.

The stacked structure may include a buffer layer 14 disposed between the substrate 12 and the first region 16. For instance, when the first region 16 is an n-type semiconductor, the buffer layer 14 may comprise an n-type gallium nitride based semiconductor.

While it is preferred to have the substrate 12, it is possible to remove the substrate 12 at some point during the formation of the LED 10. In this case, the buffer layer 14 may also be removed. A reason for removing the substrate 12 is that a non-transparent substrate may be used as the base on which the stacked structure is grown. The non-transparent substrate may allow for the formation of a higher quality stacked structure than if a transparent substrate is employed. However, a non-transparent substrate may significantly reduce light emissions from the LED 10. If the substrate 12 is removed, it is possible to later add a transparent substrate onto the buffer layer 14 or otherwise attach it to the first region 16 at a later processing step.

The stacked structure includes a junction 18, also known as an active region, between the surface 22 of the first region 16 and the second region 20. While the junction 18 is shown in FIGS. 1A–F as a discrete layer, the first region 16 and the second region 20 may abut each other, defining the junction 18 by their mutual border. Alternatively, the junction 18 may comprise multiple layers between the surface 22 of the first region 16 and the second region 20. Thus, the junction may be a simple homojunction, a single heterojunction, a double heterojunction, a single quantum well, a multiple quantum well or any other type of junction structure.

The stacked structure also defines a mesa having edges 48 bounding the mesa. In the alternative illustrated in FIG. 1A, a mesa 24a projects from the first region 16. The junction 18 and the second region 20 are included within the mesa 24a. In another alternative illustrated in FIG. 1B, a mesa 24b projects from the substrate 12. The mesa 24b preferably includes the buffer layer 14, the first region 16, the junction 18 and the second region 20. The upper face of the second region 20 defines a top surface 26 of the mesa 24a or 24b (hereinafter "the mesa 24"). A border region 46 bounds the mesa 24, which may have a square, rectangular or other geometric shape when viewed from a top perspective. One or more of the edges 48 may form sides of the LED 10. The edges 48 need not be vertical, but instead can be tapered or stepped.

The stacked structure defines a trench 36. The trench 36 includes sidewalls 38. The bottom of the trench 36 may be defined by the surface 22 or another portion of the first region 16 below the surface 22. The junction 18 and the second region 20 substantially surround the trench 36. The trench 36 may have a channel or groove-like shape when viewed from a top plan perspective. The trench 36 will be further described later in relation to FIG. 2.

Typically, an etching process forms the trench 36 after the stacked structure is deposited on the substrate 12. Portions of the layers forming the second region 20 and the junction 18 are removed by selectively etching from the top surface 26 down to the surface 22 of the first region 16 or through the top surface 22 into another portion of the first region 16. Such an etching process may use, for example, conventional photolithographic masking techniques. Alternatively, the trench 36 is defined by selective deposition. In a selective deposition process, selected areas of the surface 22 are covered with a masking material or otherwise protected from the deposition process, so that the uppermost layers comprising the active region 18 and the second region 20 are not formed in these areas.

A first electrode-pad unit 40 is disposed within the trench 36. The first electrode-pad unit 40 includes an electrode 42, which is spaced a distance 28 from the sidewalls 38 in order to prevent a short circuit. The distance 28 is preferably as small as possible in order to minimize the amount of space on the LED 10 which does not emit light. The distance 28 is dependent upon the fabrication processes used, and may typically be in the range of 6 to 10 microns. The electrode 42 is formed from electrically conductive materials in order to provide an electrical contact with the surface 22 of the first region 16. By way of example only, if the surface 22 is formed of n-type gallium nitride, the electrode 42 may be formed from one or more layers of aluminum and/or titanium. The thickness of the electrode 42 depends on the particular material(s) used. Typically, the thickness is preferably on the order of between 1.5 and 3 microns. The electrode 42 provides a trace within the trench 36, as will be explained below with reference to FIG. 2. The aggregate surface area of the trace is preferably minimized to avoid non-emitting space on the LED 10. However, tradeoffs exist between the trace width, the thickness of the electrode 42, and the length of the trace necessary to adequately spread the current across the LED 10. Generally, the thicker the electrode 42, the narrower the trace width and hence the smaller aggregate surface area of the trace. Unfortunately, the thickness of the electrode 42 may be limited by factors such as materials, processes, fabrication time and cost.

The first electrode-pad unit 40 also includes a pad 44 formed on the top surface of the electrode 42. The pad 44 is adapted to bond external leads or other structures to the electrode 42. The pad 44 may comprise multiple layers of metal 44a, 44b. For example, the pad 44 may comprise a lower layer 44a of platinum and an upper layer 44b of gold disposed over the lower layer 44a. Preferably, the first electrode-pad unit 40 is formed by depositing layers of aluminum, titanium, platinum and gold and then annealing the layers.

A second electrode-pad unit 30 is disposed over the surface 26. The second electrode-pad unit 30 comprises an electrode 32 and a pad 34. The electrode 32 substantially covers the top surface 26, and is formed from a material that will provide a low resistance, desirably ohmic contact with the semiconductor material of the top surface 26. The electrode 32 has a thickness and composition selected to be substantially reflective to light at the wavelength that will be emitted by the LED 10. Suitable materials, thickness and processing techniques for forming reflective electrodes to be used with particular semiconductor materials are well known. Merely by way of example, one suitable electrode 32 for use where the top surface 26 comprises p-type gallium nitride can be formed by applying a layer of nickel and a layer of gold onto the top surface 26 and annealing in an oxidizing atmosphere at an elevated temperature so as to oxidize the nickel.

The pad 34 is formed on the top surface of the electrode 32. The pad 34 is adapted to bond external leads or other structures to the electrode 32. The pad 34 is formed from materials compatible with the external lead and the electrode 32. By way of example only, the pad 34 may be gold. Alternatively, the pad 34 may comprise multiple layers of metal. The multiple layers may include a layer of titanium overlying the electrode 32, a layer of platinum over the titanium, and a layer of gold overlying the platinum.

An electrically insulating material may cover the stacked structure apart from the pads 34 and 44, in order to protect the structure. FIGS. 1C and D illustrate the LEDs 10 of FIGS. 1A and B, respectively, wherein the stacked structures are substantially covered by a dielectric material. The dielectric material is preferably silicon dioxide or silicon nitride. As shown in FIGS. 1C and D, the dielectric material is preferably a conformal dielectric material 80. The exposed surfaces of the pads 34 and 44 may be connected to a connection panel, as will be explained below. In operation, the die containing the LED 10 is flipped so that the substrate 12 faces upward to emit light and the pads 34 and 44 are connected to external leads on, for example, a connection panel as will be explained below with reference to FIG. 5.

Figure 1E:
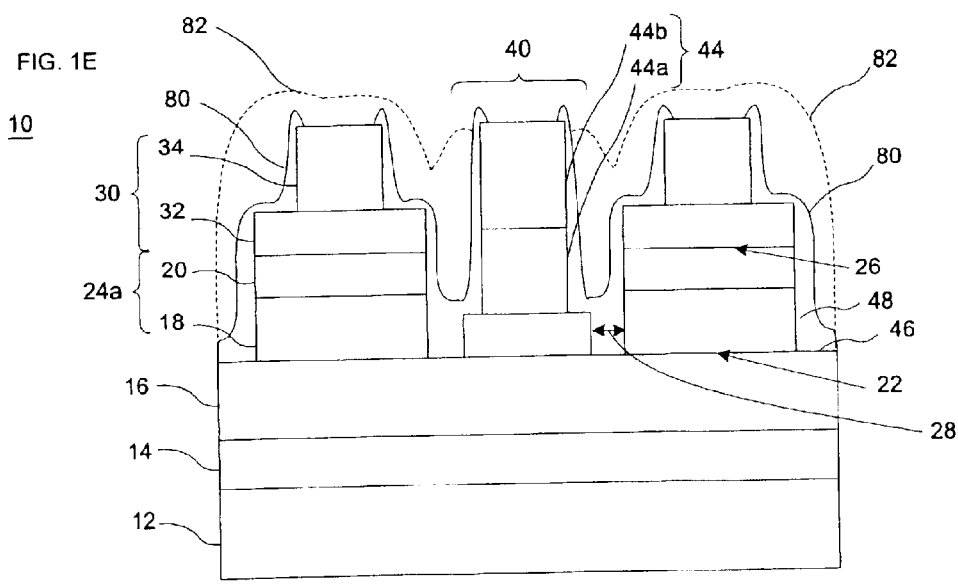
Figure 1F:
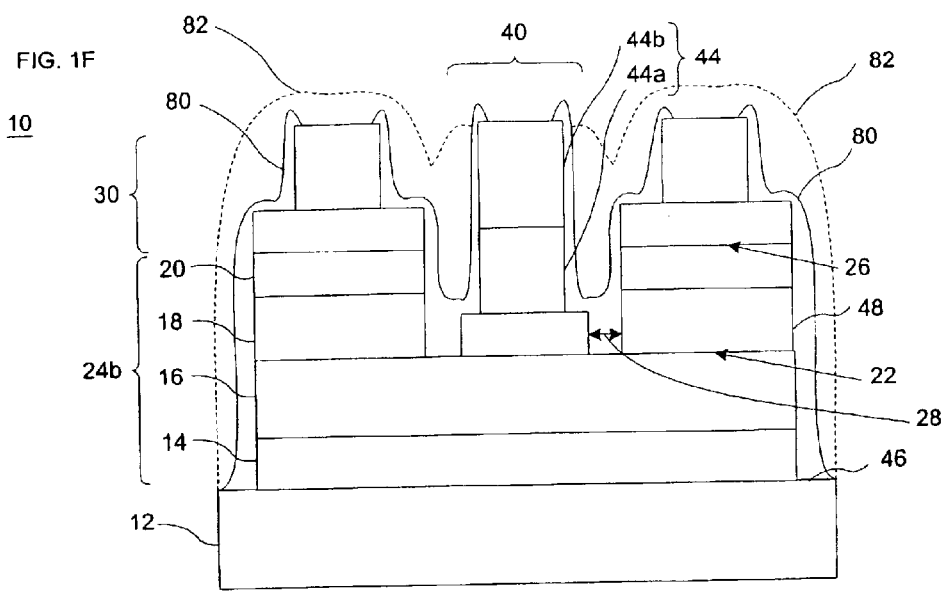

FIGS. 1E and F illustrate the LEDs 10 of FIGS. 1C and D, respectively, wherein a reflective metal cap 82 preferably substantially covers the mesa 24 and the second electrode-pad unit 30. The reflective metal cap 82 provides enhanced light extraction because it acts as a reflector. The reflective metal cap 82 preferably comprises multiple layers. The bottom layer disposed over the dielectric material 80 preferably has a high reflectivity. The bottom layer is preferably aluminum. Upper layers may have lower reflectivity than the bottom layer. In one example, the upper layers are titanium, platinum and gold, with the gold being the top most layer and the titanium overlaying the bottom layer. In another example, the reflective metal cap comprises the same layers of material as the first electrode-pad unit 40.

As shown in FIGS. 2A and B, multiple pads 34 may be distributed across the top surface of the electrode 32. Some of the pads 34 may be distributed along an exterior region 50 of the top surface of the electrode 32 adjacent the edges 48 while other pads 34 may be distributed in an interior region 52 of the top surface of the electrode 32. In a preferred embodiment, the contact area of the pads 34 is maximized across the top surface of the electrode 32. As used in this disclosure, contact area means the aggregate surface area for all of the pads 34. A reason to maximize the contact area is because the LED 10 may operate at currents from 350 mA to 1000 mA or more. Higher current translates into more light being emitted from the LED 10. Maximizing the contact area of the pads 34 provides a heat sink operable to remove the heat generated by these currents, and thereby controls the temperature of the p-n junction. For example, the p-n junction temperature may be lowered by increasing the contact area. A desired contact area may be determined by thermal modeling. Preferably, the contact area covers at least about 20% of the top surface of the electrode 32. In a preferred embodiment, the contact area is approximately 37% of the top surface area of the electrode 32.

The electrode 42 may have a segmented, loop, spiral, interdigitated/serpentine or similar elongated structure. The structure of FIGS. 2A and B have a segmented and spiral structure. The loop structure may be partly or completely closed. The electrode 42 may include a plurality of connected segments. The number of connected segments may depend on overall die width W and die length L of the LED 10. For example, the larger the LED 10, the more segments (or loops or spirals) may be employed. Preferably, the segments are connected at right angles to one another. The electrode 42 is preferably routed to provide an approximately constant distance between an outer part of the electrode 42 and edges 54 of the electrode 32, thereby promoting efficient current spreading. Preferably, the approximately constant distance is less than about 200 microns. In an example, this distance is 192 microns. One or more pads 44 are placed at selected points along the electrode 42. These selected points, or pad pockets, have a surface area at least as great as the pads 44.

The exterior region 50 may partly or wholly surround the electrode 42. Preferably, the exterior region 50 substantially surrounds the electrode 42. The electrode 42 may partly or wholly surround the pads 34 of the interior region 52. Preferably, the electrode 42 substantially surrounds the pads 34 of the interior region 52. As used herein, the term substantially surrounds means that the outer component (e.g., the exterior region 50 or the electrode 42) surrounds at least 270 degrees of the interior component (e.g., the electrode 42 or the interior region 52) about a center point.

In a preferred embodiment, the electrode 42 includes at least one corner spike 60 at an angle formed by a pair of connected segments, as shown in FIG. 2A. FIG. 2A illustrates a spiked-spiral geometry. The spiked-spiral geometry begins (or ends) at an interior location 70 and ends (or begins) at an exterior location 72. Preferably, the exterior location 72 is part of one of the corner spikes 60. The corner spikes 60 extend the electrode 42 towards remote corners 56 of the electrode 32, thereby promoting uniform current spreading. Otherwise, without the corner spike 60, the distance from the angle of a pair of connected segments to the remote corner 56 would be approximately 1.41 ($\sqrt{2}$) times greater than the distance from the outer edge of the trace the edge 54 of the electrode 32. FIG. 2B illustrates the same structure without the corner spikes 60. In FIG. 2B, the trace has a spiral geometry.

FIGS. 2C–F illustrate alternative structures for the electrode 42. Specifically, FIGS. 2C and D illustrate the electrode 42 having a serpentine design, and FIGS. 2E and F illustrate the electrode 42 having an open loop structure. FIG. 2C depicts a serpentine design without any corner spike 60, while FIG. 2D depicts a serpentine design with the corner spikes 60. The designs of FIGS. 2C and D have multiple interior regions 52. FIG. 2E depicts an open loop structure without corner spikes 60, while FIG. 2F depicts an open loop structure with corner spikes 60. The open loop structures of FIGS. 2E and F preferably have the electrode 42 equidistant from a center point 58 and the edges 54. The traces illustrated in FIGS. 2A–F are designed to equalize the spreading distance from any point on the LED 10.

FIG. 3 shows a portion of the electrode 42 having a width $W_t$. Preferably, the width $W_t$ is minimized to provide the maximum allowed resistance for the die with a given maximum distance between the pads 44 and a point 62 (FIG. 2A) on the trace farthest from the pads 44. In the embodiment of FIG. 3, the pad 44 is circular and has a diameter 64 greater than the width $W_t$. In order to accommodate the diameter 64 of the pad 44, the electrode 42 has a circular shape surrounding the bottom of the pad 44. This part of the electrode 42 has a diameter 66 at least as great as the diameter 64 of the pad 44.

The width $W_t$ may be varied to provide substantially the same resistance between various areas of the electrode 42 (and the pads 44). FIGS. 4A–C illustrate examples of different parts of the electrode 42 having differing widths. FIG. 4A shows an embodiment where some segments of the electrode 42 have a width $W_1$ while the corner spike 60 has a width $W_2$. The width $W_2$ may be wider or narrower than the width $W_1$. The corner spike 60 preferably includes a base 74 connected to the electrode 42 and a top 76 opposite the base 74. FIG. 4B shows another embodiment where some segments of the electrode 42 have the width $W_1$ while a cone-shaped spike 68 has a variable width $W_A$ that narrows toward the tip 76. FIG. 4C illustrates yet another embodiment where one segment of the electrode 42 has the width $W_1$, an adjacent segment has the width $W_2$, and the corner spike 60 has a third width $W_3$.

Figure 5:
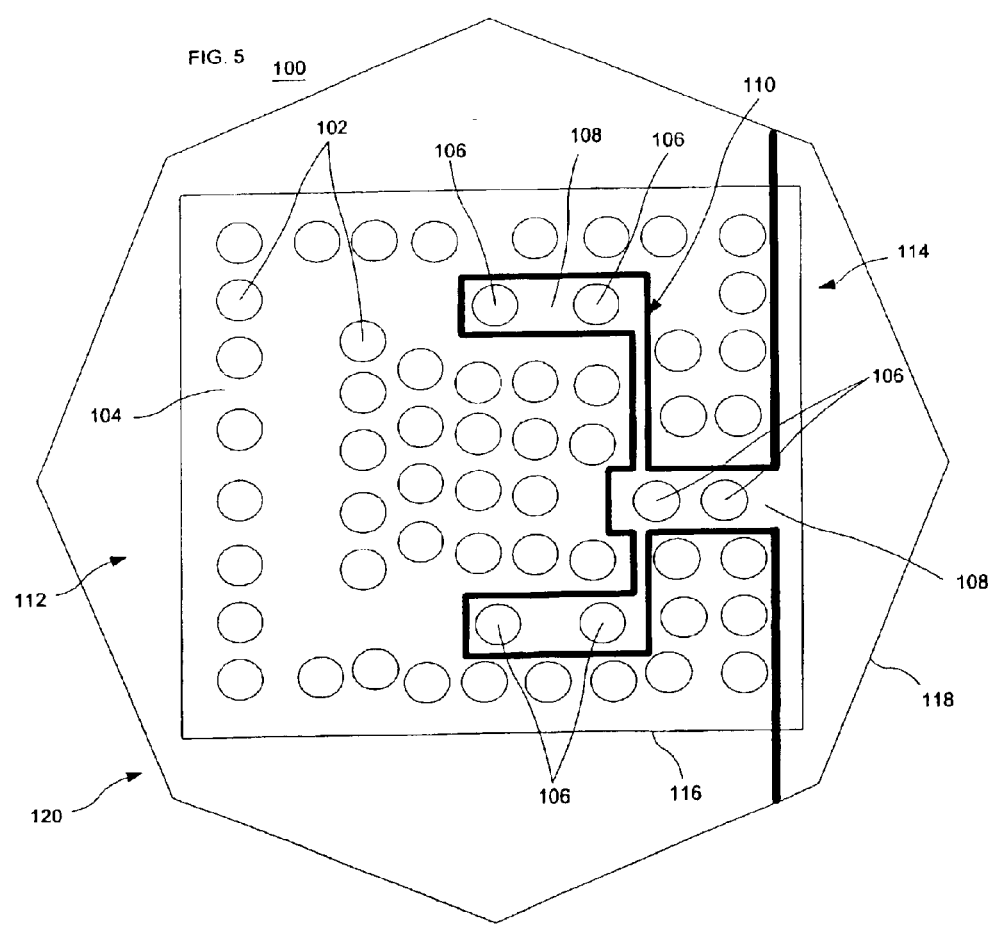
FIG. 5 is a bottom plan view of an LED connection panel.

FIG. 5 illustrates a bottom plan view of a connection panel 100, also known as a "sub-mount," which attaches to the LED 10. The connection panel 100 may include a chip with sides 116 having one or more p-connections 102 for attaching to the pads 34 and one or more n-connections 106 for attaching to the pads 44. The bottom plan view of FIG. 5 shows the p-connections 102 and the n-connections 106 at mirror image locations relative to the pads 34 and the pads 44, respectively, of FIG. 2A. The p-connections 102 are mounted on a surface 104 and the n-connections are mounted on a surface 108. The p-connections 102, the n-connections 106, the surface 104 and the surface 108 are metallic. The surfaces 104, 108 are mounted on a panel or substrate 120. The surfaces 104 and 108 are preferably part of a "seed layer" which will be explained below with respect to FIGS. 6A and B.

The surface 108 is separated from the surface 104 by a buffer 110. The buffer 110 is preferably a gap or space between the surfaces 104 and 108. A lead 112 connects to the surface 104 and a lead 114 connects to the surface 108, providing connections leading off of the connection panel 100. The connection panel 100 has exterior edges 118 which may form a square, rectangular, octagonal or other geometric shape, the same as or different from the shape of the LED 10.

FIGS. 6A–B are cross-sectional views of the connection panel 100 showing the substrate 120 with the p-connections 102 and the n-connections 106 disposed thereon. The substrate 120 may comprise silicon, alumina, aluminum nitride, Gallium-nitride, SiC, sapphire or other suitable semiconductor or ceramic materials which are thermally conductive. Good thermal conductivity allows the connection panel 100 to extract heat from the LED 10. The substrate 120 is preferably as thin as possible.

The surfaces 104 and 108 are preferably part of seed layers 122 and 124, respectively. The seed layers 122 and 124 may be one or more layers of metal having very low resistance formed on the substrate 120. The resistance is preferably orders of magnitude lower than resistance in the LED 10. The seed layer 122 may be chosen to provide substantially the same voltage to all of the p-connections 102, as well as acting as a heat sink. The seed layers 122 and 124 are preferably thick films comprising two layers each, a base layer 122a or 124a and a top layer 122b or 124b. The base layers 122a and 124a are preferably titanium, and the top layers 122b and 124b are preferably copper or gold. The seed layers 122 and 124 may be formed together in one process by first depositing the base layer 122a/124a over the substrate 120 and then depositing the top layer 122b/124b over the base layer 122a/124a. The p-connections 102, the n-connections 106 and the leads 112 and 114 may be deposited on the top layers 122b/124b. Next, a photoresist mask may be patterned over the top layer 122b/124b, connections 102 and 106 and leads 112 and 114. The buffer 110 may then be formed by etching away the top layer 122b/124b and bottom layer 122a/122b according to the photoresist mask pattern. The photoresist mask may then be removed and an isolating dielectric material 126 may be deposited as shown in FIG. 6B. Preferably, the dielectric material 126 is deposited by means of plasma-enhanced chemical vapor deposition ("PECVD"). Alternatively, after the seed layers 122 and 124 are formed, the dielectric material 126 may be deposited on top. A photoresist pattern may then be formed over the dielectric material 126 and the dielectric material 126 may be etched to open spaces to the surfaces 104 and 108. Then the p-connections 102 and the n-connections 106 may be deposited, plated or otherwise formed on the surfaces 104 and 108.

The p-connections 102 and the n-connections 106 are preferably thermasonically bonded to the pads 34 and 44, respectively, of the LED 10. Thermasonic bonding entails applying heat and an ultrasonic sound along with a certain amount of force against one or more of the components that will be bonded together, as is known in the art.

The p-connections 102, n-connections 106 and leads 112 and 114 preferably comprise two layers. The p-connections 102 preferably comprise a base 102a and a top 102b, wherein the base 102a is of the same metal as the top layer 122b, e.g. copper. Similarly, the n-connections 106 preferably comprise a base 106a and a top 106b, wherein the base 104a is of the same metal as the top layer 124b, e.g. copper. Furthermore, the leads 112 and 114 may comprise two layers, 112a and 112b and 114a and 114b, respectively, wherein the layers 112a and 114a are of the same metal as the top layers 122b and 124b. The tops 102b and 106b are preferably the same metal as the pads 34 and the pads 44b (FIGS. 1A–F) respectively, e.g. gold. Similarly, the layers 112b and 114b are preferably gold. FIG. 7 is a perspective view of the LED 10 mounted to the connection panel 100. The LED 10 is mounted on a flip-chip arrangement, with the substrate 12 facing away from the connection panel 100. As shown in the figure, the edges 48 of the LED 10 form a square, while the edges 118 of the connection panel 100 form an octagon. The octagonal shape is self-aligning when fit into a circular reflecting cup (not shown), as is common in LED fabrication.

It should be appreciated that the figures are not drawn to scale. In particular, the thickness of the various layers illustrated in FIGS. 1A–F are greatly exaggerated for clarity of illustration. Typically, the entire stack, including the mesa, is on the order of five microns thick. As shown in FIGS. 2A–F, the horizontal dimensions of the die, such as the overall die width W and die length L are preferably on the order of a few hundred microns or more, up to approximately 2 mm. However, larger dies may also be employed. The die is typically rectangular or, most preferably, square with equal width W and length L.

The efficient current spreading and heat sinking capability afforded by embodiments of the present invention facilitates the use of high currents. In one embodiment, the LED 10 may support a current a 350 mA, a forward voltage of 3.3 volts, and a chip series resistance of 2 Ω. In another embodiment, the LED 10 may support current of at least 1000 mA, a forward voltage of 3.3 volts, and a chip series resistance of 2 Ω.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A light-emitting diode comprising:
   (a) a structure including
      (i) a region of n-type semiconductor; and
      (ii) a region of p-type semiconductor overlying the n-type region and defining a top surface remote from the n-type region, the structure defining an active light-emitting region between the n-type region and the p-type region, said structure having edges bounding said top surface;
   (b) a p-type electrode-pad unit including a p-electrode and a p-pad, the p-electrode being disposed on the top surface and the p-pad being disposed on the p-electrode;
   (c) an elongated trench extending into said structure from said top surface through the p-type region and the active light-emitting region to the n-type region, the elongated trench being entirely surrounded by the p-electrode; and
   (d) an n-type electrode pad unit including
      (i) an elongated n-electrode disposed in the elongated trench in contact with said n-type region; and
      (ii) a plurality of n-pads disposed on the elongated n-electrode and distributed along the elongated trench, the n-pads being entirely surrounded by the p-electrode.

2. The light-emitting diode of claim 1, further including a transparent substrate underlying the n-type region.

3. The light-emitting diode of claim 1, the n-type region and the p-type region are GaN-based semiconductors.

4. The light-emitting diode of claim 1, wherein the n-type region and the p-type region are GaP-based semiconductors.

5. The light-emitting diode of claim 1, wherein the n-type region and the p-type region are GaAs-based semiconductors.

6. The light-emitting diode of claim 1, wherein the elongated n-electrode includes a plurality of connected segments.

7. The light-emitting diode of claim 6, wherein the plurality of connected segments are connected to each other at right angles.

8. The light-emitting diode of claim 6, wherein one of the plurality of connected segments has a first width and another of the plurality of connected segments has a second width different from the first width.

9. The light-emitting diode of claim 1, wherein the elongated n-electrode has a spiral geometry.

10. The light-emitting diode of claim 1, wherein the elongated n-electrode has a serpentine geometry.

11. The light-emitting diode of claim 1, wherein the elongated n-electrode has an open loop geometry.

12. The light-emitting diode of claim 1, wherein the p-electrode is a reflective electrode substantially overlying the top surface and the p-pad comprises a plurality of p-pads distributed across the reflective electrode.

13. The light-emitting diode of claim 12, wherein the plurality of p-pads include a first plurality of p-pads surrounding the trench and a second plurality of p-pads surrounded by the trench.

14. The light-emitting diode of claim 12, further comprising a dielectric material substantially covering the p-type region, the reflective electrode and sides of the plurality of p-pads.

15. The light-emitting diode of claim 1 further comprising a connection panel, said structure being mounted on said connection panel with said top surface facing toward said connection panel and said n-type region facing away from said connection panel.

16. The light-emitting diode of claim 15, wherein said connection panel has one or more p-connections and one or more n-connections, said p-pad comprising one or more p-pads, said p-pads being connected to said p-connections, and said n-pads being connected to said n-connections.

17. The light-emitting diode of claim 16, wherein said connection panel includes a mounting surface.

18. The light-emitting diode of claim 17, wherein said mounting surface is substantially rectangular.

19. The light-emitting diode of claim 16, wherein said connection panel has outer edges, providing an octagonal shape.

20. The light-emitting diode of claim 16, wherein said connection panel has outer edges, providing a hexagonal shape.

21. The light-emitting diode of claim 16, wherein said p-connections include solder balls.

22. The light-emitting diode of claim 21, wherein said solder balls are disposed to maximize a contact area, whereby the contact area acts as a heat sink.

23. The light-emitting diode of claim 22, wherein said contact area covers at least 20% of the p-electrode.

24. The light-emitting diode of claim 16, wherein the one or more p-connections are thermosonically bonded to the one or more p-pads.

25. A light-emitting diode comprising:
   (a) a substantially rectangular structure including:
      (i) a region of n-type semiconductor; and
      (ii) a region of p-type semiconductor overlying the n-type region and defining a top surface remote from the n-type region, the structure defining an active light-emitting region between the n-type region and the p-type region, said structure having edges bounding said top surface;
   (b) a p-type electrode-pad unit including a p-electrode and a p-pad, the p-electrode being disposed on and substantially covering the top surface and the p-pad being disposed on the p-electrode;
   (c) a trench remote from said edges extending into said structure from said top surface through the p-type region and the active light-emitting region to the n-type region, the trench being substantially surrounded by the p-electrode; and (d) an n-type electrode pad unit including:
  (i) an elongated n-electrode disposed in the trench in contact with said n-type region; and
  (ii) an n-pad disposed on the elongated n-electrode, said trench and said elongated n-electrode each having a configuration, as seen in plan view from said top surface, including a main region and at least one spike region projecting outwardly from said main region toward said edges, the at least one spike region of the n-electrode having a base connected to the main region of the n-electrode and an end opposite the base, said main region being substantially in the form of one of a rectangular loop, a rectangular spiral, and a serpentine form, said main region having sides parallel to the edges bounding the top surface and having corners adjacent to corners of the rectangular top surface, the at least one spike region of the elongated n-electrode extending from one of the corners of the main region outward towards one of the corners of the structure.

26. The light-emitting diode of claim 25, wherein said structure is substantially rectangular as seen in plan view, said main region of said elongated n-electrode is substantially in the form of a rectangular loop having sides parallel to the edges bounding the top surface and having corners adjacent to corners of the rectangular top surface, and the at least one spike region of the elongated n-electrode extends from one of the corners of the rectangular loop outward towards one of the corners of the structure.

27. The light-emitting diode of claim 25, wherein said structure is substantially rectangular as seen in plan view, said main region of said elongated n-electrode is substantially in the form of a rectangular spiral having sides parallel to the edges bounding the top surface and having corners adjacent to corners of the rectangular top surface, and the at least one spike region of the elongated n-electrode extends from one of the corners of the rectangular spiral outward towards one of the corners of the structure.

28. The light-emitting diode of claim 25, wherein said structure is substantially rectangular as seen in plan view, said main region of said elongated n-electrode is substantially in a serpentine form having sides parallel to the edges bounding the top surface and having corners adjacent to corners of the rectangular top surface, and the at least one spike region of the elongated n-electrode extends from one of the corners of the serpentine form outward towards one of the corners of the structure.

29. The light-emitting diode of claim 26, wherein the rectangular loop is not closed.

30. A light-emitting diode comprising:
(a) a structure including:
  (i) a region of n-type semiconductor; and
  (ii) a region of p-type semiconductor overlying the n-type region and defining a top surface remote from the n-type region, the structure defining an active light-emitting region between the n-type region and the p-type region, said structure having edges bounding said top surface;
(b) a p-type electrode-pad unit including a p-electrode and a p-pad, the p-electrode being disposed on and substantially covering the top surface and the p-pad being disposed on the p-electrode;
(c) a trench remote from said edges extending into said structure from said top surface through the p-type region and the active light-emitting region to the n-type region, the trench being substantially surrounded by the p-electrode; and (d) an n-type electrode pad unit including:
  (i) an elongated n-electrode disposed in the trench in contact with said n-type region; and
  (ii) an n-pad disposed on the elongated n-electrode, said trench and said elongated n-electrode each having a configuration, as seen in plan view from said top surface, including a main region and at least one spike region projecting outwardly from said main region toward said edges, the at least one spike region of the n-electrode having a base connected to the main region of the n-electrode and an end opposite the base, the main region of the elongated n-electrode having a first width and the at least one spike region of the elongated n-electrode having a second width different from the first width, wherein the second width tapers towards the end of the at least one spike region.

31. A light-emitting diode comprising:
(a) a structure including:
  (i) a region of n-type semiconductor; and
  (ii) a region of p-type semiconductor overlying the n-type region and defining a top surface remote from the n-type region, the structure defining an active light-emitting region between the n-type region and the p-type region, said structure having edges bounding said top surface;
(b) a p-type electrode-pad unit including a reflective p-electrode and a plurality of p-pads, the p-electrode being disposed on the top surface and the p-pads being disposed on and distributed across the p-electrode;
(c) a trench remote from said edges extending into said structure from said top surface through the p-type region and the active light-emitting region to the n-type region;
(d) an n-type electrode pad unit including:
  (i) an elongated n-electrode disposed in the trench in contact with said n-type region; and
(ii) an n-pad disposed on the elongated n-electrode;
a dielectric material substantially covering the p-type region, the reflective electrode and sides of the plurality of p-pads; and
a reflective metal cap disposed over the dielectric material and substantially encompassing the plurality of p-pads.

32. A light-emitting diode comprising:
(a) a structure including
  (i) a transparent substrate;
  (ii) a region of n-type GaN based semiconductor overlying the transparent substrate; and
  (iii) a region of p-type GaN based semiconductor overlying the n-type region and defining a top surface remote from the transparent substrate, the structure defining an active light-emitting region between the n-type region and the p-type region, said structure having edges bounding said top surface;
(b) a p-type electrode-pad unit including a reflective p-electrode and one or more p-pads, the reflective p-electrode having an outer edge and being disposed on and substantially covering the top surface, and the p-pads being disposed on the reflective p-electrode;
(c) a trench remote from said edges extending into said structure from said top surface through the p-type and the active light-emitting regions to the n-type region, the reflective p-electrode substantially surrounding said trench with the outer edge being remote from said trench; and (d) an n-type electrode pad unit including
   (i) an elongated n-electrode disposed in the trench in contact with said n-type region, said elongated n-electrode including an edge; and
   (ii) one or more n-pads disposed on the elongated n-electrode, wherein said trench and said elongated n-electrode each have a configuration, as seen in plan view from said top surface, including a main region in the form of a spiral and a plurality of spike regions projecting outwardly from said main region toward said edges, the spike regions of the elongated n-electrode each having a base connected to the main region of the elongated n-electrode and an end opposite the base, the edge of said elongated n-electrode being spaced at a distance from the outer edge of said reflective p-electrode such that current spreading is substantially uniform across the light-emitting diode.

33. The light-emitting diode of claim 32, further comprising a connection panel having one or more p-connections and one or more n-connections, said structure being mounted on said connection panel with said top surface facing toward said connection panel and said transparent substrate facing away from said connection panel, said p-pads being connected to said p-connections and said n-pads being connected to said n-connections.

34. The light-emitting diode of claim 33, wherein said p-connections form a contact area covering approximately 37% of the p-electrode.

35. The light-emitting diode of claim 33, wherein the connection panel is octagonal.

36. The light-emitting diode of claim 35, wherein the structure is square.

37. The light-emitting diode of claim 33, wherein the connection panel is hexagonal.

* * * * *